US006894426B2

(12) United States Patent

Shimizu

(10) Patent No.: US 6,894,426 B2
(45) Date of Patent: May 17, 2005

(54) ULTRASONIC PROBE

(75) Inventor: Yasuo Shimizu, Saitama (JP)

(73) Assignee: Nihon Dempa Kogyo Co., Ltd., Tokyo (JP)

(*) Notice: Subject to any disclaimer, the term of this patent is extended or adjusted under 35 U.S.C. 154(b) by 299 days.

(21) Appl. No.: 10/403,338

(22) Filed: Mar. 28, 2003

(65) Prior Publication Data

US 2003/0189391 A1 Oct. 9, 2003

(30) Foreign Application Priority Data

Mar. 29, 2002 (JP) ....................................... 2002-096432

(51) Int. Cl.[7] ................................................ H01L 41/08

(52) U.S. Cl. ........................................ 310/334; 310/322

(58) Field of Search ......................... 310/322, 326–327, 310/340, 343, 334–336, 366, 365; 600/459–437; 73/626

(56) References Cited

U.S. PATENT DOCUMENTS 4,507,582 A * 3/1985 Glenn ......................... 310/335
5,392,259 A * 2/1995 Bolorforosh ................. 310/334
5,640,370 A * 6/1997 Hanafy et al. .............. 310/334
5,886,454 A * 3/1999 Ito et al. ...................... 310/334
6,278,224 B1 * 8/2001 Sawada et al. ............. 310/334
6,406,433 B1 * 6/2002 Mamayek .................. 29/25.35
6,558,332 B1 * 5/2003 Shimizu ..................... 600/459

FOREIGN PATENT DOCUMENTS

JP 05-023331 2/1993
JP 07-274292 10/1995

* cited by examiner

*Primary Examiner*—Burton S. Mullins
*Assistant Examiner*—Karen Beth Addison
(74) *Attorney, Agent, or Firm*—Knobbe Martens Olson & Bear LLP

(57) ABSTRACT

An ultrasonic probe has a strip-shaped piezoelectric unit having a uniform thickness and a grounding electrode formed on the top surface, a backing material, and an acoustic matching layer bonded on the top surface of the piezoelectric unit. A conductive film is formed on a protrusively curved top surface of the backing material for applying a signal thereto for driving the piezoelectric unit. A conductive adhesive is applied between the backing material and the bottom surface of the piezoelectric unit. The conductive adhesive has a thickness which varies along the longitudinal direction of the piezoelectric unit, thereby causing a larger driving current to flow at the center of the piezoelectric unit in the longitudinal direction, and a smaller driving current to flow at both ends of the piezoelectric unit to suppress side lobes in generated ultrasonic waves.

8 Claims, 5 Drawing Sheets

ULTRASONIC PROBE

BACKGROUND OF THE INVENTION

1. Field of the Invention

The present invention relates to an ultrasonic probe, and, more particularly, to an ultrasonic probe which has a weighted piezoelectric unit for generating ultrasonic waves.

2. Description of the Related Art

An ultrasonic probe is utilized as an ultrasonic transducer, which transmits and receives ultrasonic waves, in a medical ultrasonic diagnosis apparatus for providing information on the interior of a disease in a living body, by way of example. The ultrasonic probes are classified into several types by their functions and shape, one of which is an array type ultrasonic probe. The array type ultrasonic probe comprises a plurality of strip-shaped piezoelectric units arranged in their width direction, to which an electronic scanning method such as a sector driving method or the like is applied.

FIG. 1 illustrates the configuration of a conventional array type ultrasonic probe. The probe comprises a plurality of strip-shaped piezoelectric units 2, each of which has electrodes 1*a* and 1*b* formed on both main surfaces, respectively. Piezoelectric units 2 are arranged on backing material 3 in the width direction of piezoelectric units 2. The width direction of piezoelectric units 2 is defined in a left-to-right direction in FIG. 1, while the longitudinal direction of piezoelectric units 2 in a direction from the plane of the drawing sheet to the back. Acoustic matching layer 4 is provided to cover transmitting and receiving surfaces of respective piezoelectric units 2. In addition, filler 5 is filled in gaps between respective piezoelectric units 2. Actually, acoustic matching layer 4 is provided on a piezoelectric plate before it is separated into respective piezoelectric units 2, and then filler 5 is filled, so that filler 5 also extends through acoustic matching layer 4.

In regard to the array type ultrasonic probe as described above, JP, 5-23331, A and JP, 7-274292, A propose that each piezoelectric unit 2 is weighted in the longitudinal direction of piezoelectric unit 2 to enhance the vibration amplitude in a central region in the longitudinal direction and to reduce the vibration amplitude in both end regions, thereby providing ultrasonic beams with smaller side lobes.

FIGS. 2 and 3 are side cross-sectional views each illustrating an example of a weighted ultrasonic probe. FIGS. 2 and 3 illustrate cross-sectional structures in a plane perpendicular to the cross-section in FIG. 1, so that the left-to-right direction in the figures corresponds to the longitudinal direction of piezoelectric unit 2.

In the ultrasonic probe illustrated in FIG. 2, piezoelectric unit 2 is divided into a plurality of piezoelectric elements in the longitudinal direction. Here, piezoelectric unit 2 is divided into five piezoelectric elements 2*d*, 2*b*, 2*a*, 2*c*, and 2*e*, as illustrated in left to right, each of which is weighted. These piezoelectric elements 2*a* to 2*e* are electrically connected in parallel with one another. Piezoelectric elements 2*a* to 2*e* are weighted such that the degree of polarization is maximized in central piezoelectric element 2*a*, and becomes gradually smaller toward piezoelectric elements 2*d* and 2*e*, respectively, upon the poling process for piezoelectric unit 2. By thus controlling the degree of polarization in piezoelectric elements 2*a* to 2*e*, the vibration amplitude is maximized in central piezoelectric element 2*a* and minimized in piezoelectric elements 2*d* and 2*e* at both ends, even if respective piezoelectric elements 2*a* are applied with the same driving voltage, resulting in a smaller beam width of ultrasonic waves in the longitudinal direction of piezoelectric unit 2 to provide an ultrasonic beam with suppressed side lobes.

Likewise, in the ultrasonic probe illustrated in FIG. 3, piezoelectric unit 2 is divided into a plurality of piezoelectric elements, here, 2*d*, 2*b*, 2*a*, 2*c*, and 2*e*. Central piezoelectric element 2*a* is directly applied with a driving voltage, while the remaining piezoelectric elements 2*b* to 2*e* are applied with the driving voltage through respective resistors 6. Here, the resistances of resistors 6 are controlled to supply a maximum current to central piezoelectric element 2*a* and a minimum current to piezoelectric elements 2*d* and 2*e* at both ends. In this way, the vibration amplitude is maximized in central piezoelectric element 2*a* and minimized in both end piezoelectric elements 2*d* and 2*e*, thereby providing an ultrasonic beam with suppressed side lobes.

In the foregoing conventional ultrasonic probes, however, the piezoelectric unit must be mechanically divided into a plurality of piezoelectric elements in the longitudinal direction for weighting the piezoelectric unit, giving rise to a problem of complicated manufacturing process. Since a signal line is routed for each piezoelectric element to apply the driving voltage, the resulting ultrasonic probe also has a complicated structure. The complexity of the structure as well as manufacturing process causes a reduction in productivity of the ultrasonic probe. Also, the weighting as mentioned above can only change the vibration amplitude in steps, i.e., on an element-by-element basis, thus failing to sufficiently suppress side lobes. Furthermore, if the piezoelectric elements are weighted by changing the degree of polarization for each piezoelectric element, the ultrasonic probe will experience difficulties in controlling even the vibration amplitude.

SUMMARY OF THE INVENTION

It is an object of the present invention to provide an ultrasonic probe which is capable of facilitating the weighting for a piezoelectric unit to suppress side lobes and maintaining high productivity.

The object of the present invention is achieved by an ultrasonic probe which includes a backing material, a piezoelectric unit disposed on the backing material, an acoustic matching layer disposed on the piezoelectric unit, and a conductive adhesive applied to have a non-uniform thickness in a gap between the piezoelectric unit and the backing material and/or in a gap between the piezoelectric unit and the acoustic matching layer, wherein the piezoelectric unit is applied with a driving current through the conductive adhesive.

In the present invention, the gap size between the piezoelectric unit and backing material and/or the gap size between the piezoelectric unit and acoustic backing layer is varied along the longitudinal direction of the piezoelectric unit. Since the conductive adhesive is interposed in these gap or gaps, the varying thickness of the conductive adhesive causes a change in the magnitude of a resistance connected substantially in series with the piezoelectric unit at a particular position on the piezoelectric unit. Since a current flowing into the piezoelectric unit is in general reciprocally proportional to the resistance, the vibration amplitude can be controlled at a particular position on the piezoelectric unit based only on the distribution of the thickness of the conductive adhesive. It is therefore possible, according to the present invention, to provide an ultrasonic probe which facilitates the weighting of the piezoelectric unit to sufficiently suppress side lobes in generated ultrasonic waves without further dividing the piezoelectric unit into piezoelectric elements, while maintaining high productivity.

DETAILED DESCRIPTION OF THE INVENTION

Figure 1:
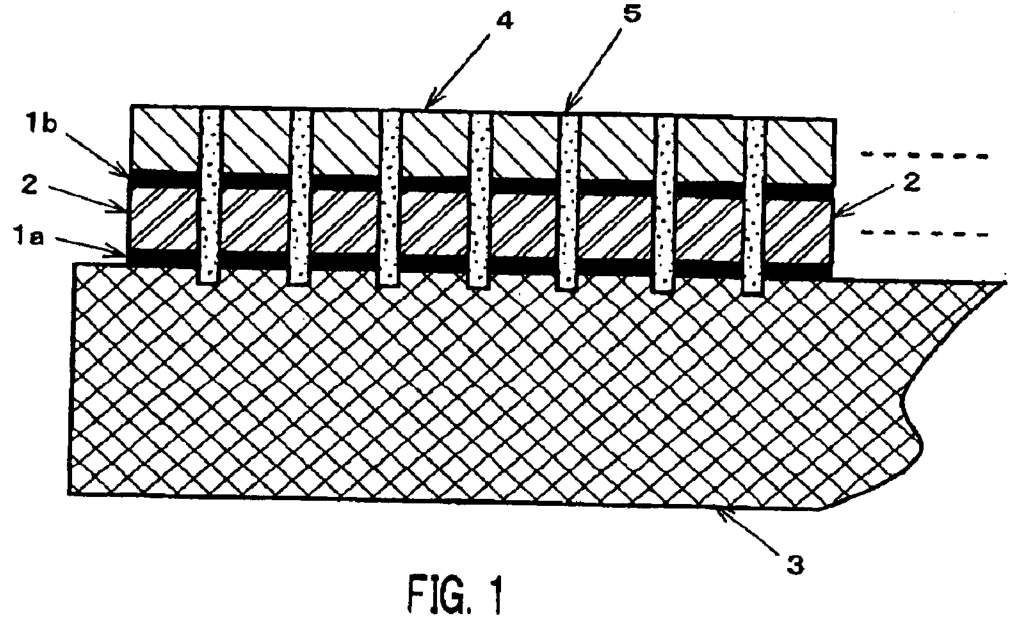
FIG. 1 (BACKGROUND ART)
FIG. 1 is a front sectional view illustrating an example of conventional array type ultrasonic probe.
Figure 2:
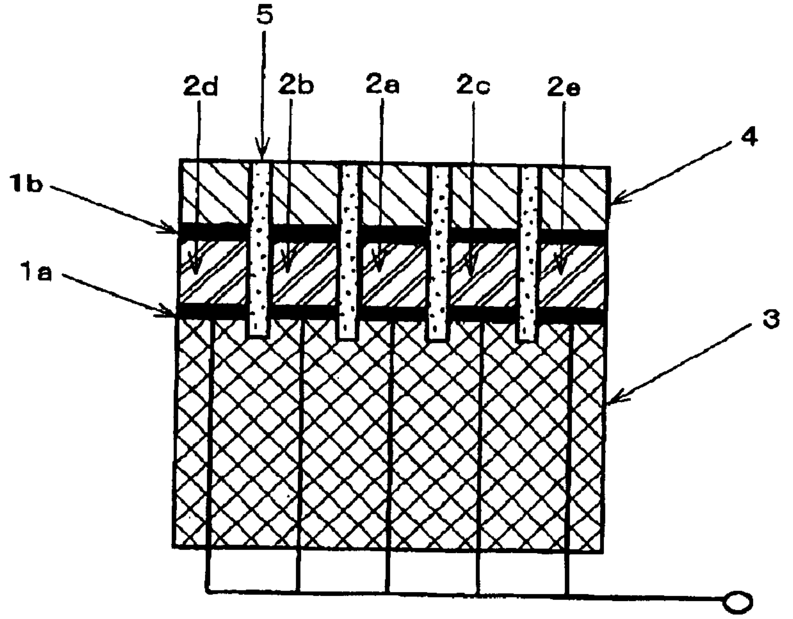
FIG. 2 (BACKGROUND ART)
FIG. 2 is a side sectional view illustrating an array type ultrasonic probe which is configured to vary the polarizability of piezoelectric elements on an element-by-element basis.
Figure 3:
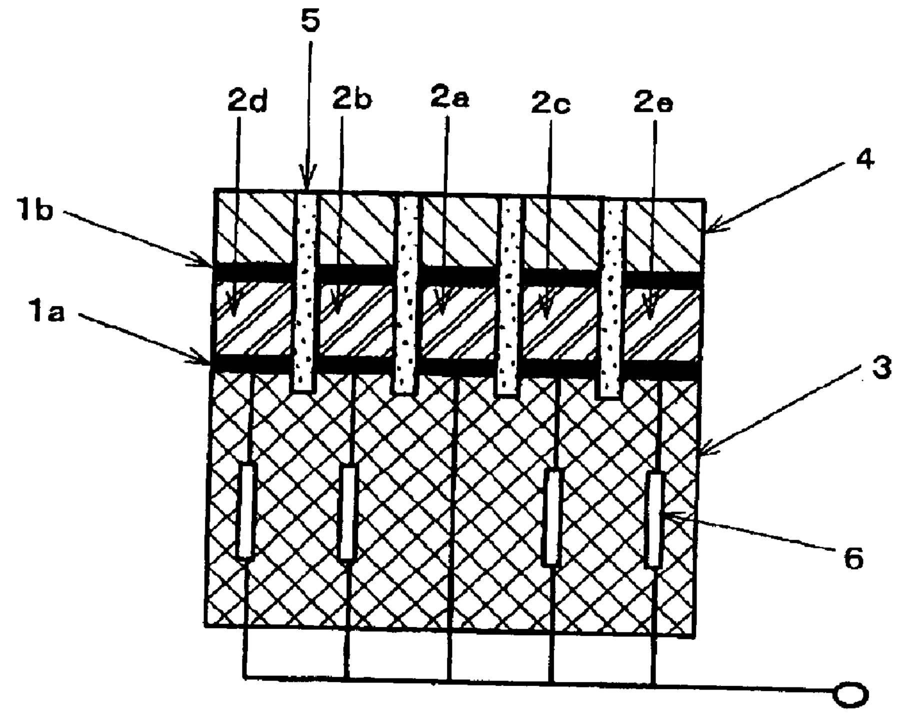
FIG. 3 (BACKGROUND ART)
FIG. 3 is a side sectional view illustrating an array type ultrasonic probe which has series resistors having different resistances associated with and connected to respective piezoelectric elements.
Figure 4A:
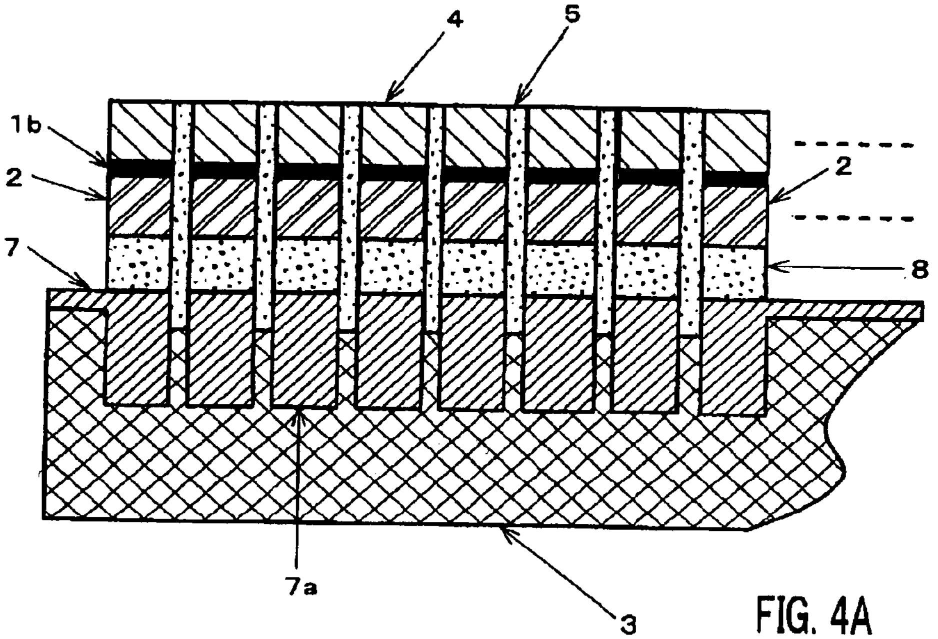
FIGS. 4A and 4B are a front view and a side sectional view, respectively, of an array type ultrasonic probe according to a first embodiment of the present invention.
Figure 4B:
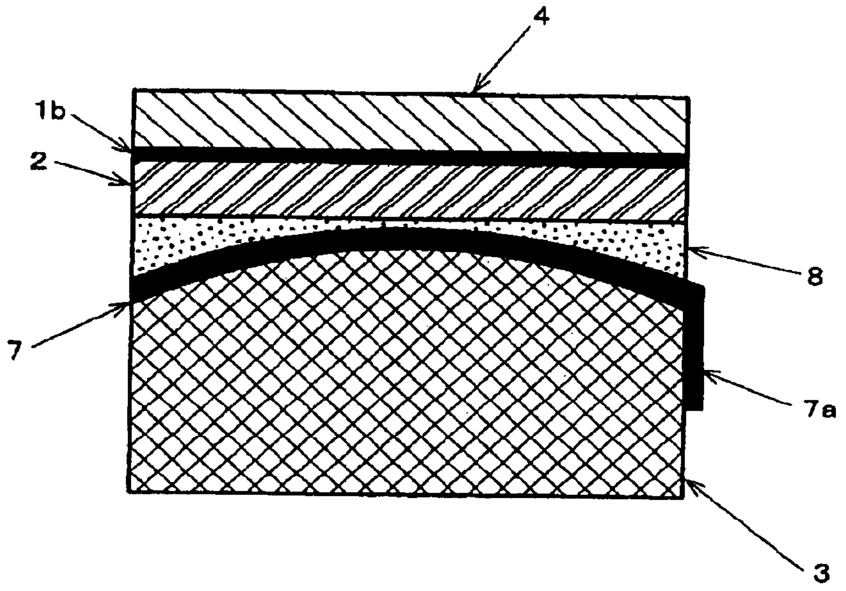

In FIGS. 4A and 4B which illustrate an array type ultrasonic probe according to a first embodiment of the present invention, the same components as those in FIGS. 1 to 3 are designated the same reference numerals. FIG. 4A is a front view of the ultrasonic probe, wherein the left-to-right direction corresponds to the longitudinal direction of the ultrasonic probe and the width direction of piezoelectric unit 2. FIG. 4B illustrates a cross-sectional shape of the ultrasonic probe on a plane perpendicular to a plane illustrated in FIG. 4A, just showing one piezoelectric unit 2 in a cross section taken along a plane in the longitudinal direction thereof.

A plurality of strip-shaped piezoelectric units 2 are disposed on backing material 3 in the width direction of piezoelectric units 2. Piezoelectric units 2 have a uniform thickness. Here, each piezoelectric unit 2 is formed with electrode 1*b* only on the top surface, which serves as a surface for transmitting and receiving ultrasonic wave, but not formed with any electrode on the bottom surface of piezoelectric unit 2, i.e., the surface opposite to backing material 3, so that a piezoelectric material constituting piezoelectric unit 2 is exposed on this surface as it is. Acoustic matching layer 4 is bonded on electrode 1*b* on the top surface of piezoelectric unit 2.

Backing material 3 has a protrusively curved top surface such that it has a ridge extending in the longitudinal direction of the ultrasonic probe, i.e., in the width direction of piezoelectric units 2. Conductive film (e.g., metal film) 7 is further formed over the entire top surface of backing material 3, for example, by vapor deposition. Thus formed conductive film 7 extends to one end face of backing material 3. On this end face, conductive film 7 is divided corresponding to respective piezoelectric units 2. Conductive film 7 divided for each piezoelectric unit 2 on the end face is called "divided conductive film 7*a*."

Conductive adhesive 8 is interposed in a gap between the bottom surfaces of piezoelectric units 2 and the top surface of backing material 3, i.e., conductive film 7. As mentioned above, the top surface of backing material 3 is made convex to form a ridge in a central region, so that conductive film 8 has a minimum thickness at the center of strip-shaped piezoelectric unit 2 in the longitudinal direction of piezoelectric unit 2. The thickness continuously increases toward both ends of piezoelectric unit 2 in the longitudinal direction. A material having a larger volume resistivity than that of conductive film 7 is used for conductive adhesive 8. For example, an adhesive mixed with carbons (C) as conductive grains is used for conductive adhesive 8. The resistance of the conductive adhesive per unit volume is preferably in a range of 1 to 10 Ω·cm or higher.

Next described is a process of manufacturing the ultrasonic probe. A piezoelectric plate provided for the process has a size corresponding to a plurality of piezoelectric units 2, and is previously formed with electrode 1*b* and acoustic matching layer 4 over the entire top surface. Backing material 3 also provided for the process has the top surface formed in a convex shape, and is formed with conductive film 7 and divided conductive films 7*a*. Then, conductive adhesive 8 is applied on backing material 3, and the piezoelectric plate is secured on backing material 3 by this conductive adhesive 8. Next, grooves reaching backing material 3 are formed from above acoustic matching layer 4 in order to divide the piezoelectric plate into a plurality of strip-shaped piezoelectric units 2. In this event, conductive film 7 is also divided by the grooves. Subsequently, filler 5 is applied in the grooves, and, for example, a flexible wiring board, not shown, is connected to each divided conductive film 7*a*, thereby completing the ultrasonic probe.

The array type ultrasonic probe as described above uses electrode 1*b* formed on the top surface of piezoelectric unit 2 as a ground electrode, and each piezoelectric unit 2 is applied with an electric pulse for sector driving. When the electric pulse is applied, the electric resistance of conductive film 7 is negligible as compared with the electric resistance of conductive adhesive 8, so that conductive film 7 is held at the same potential as a whole to generate an electric field between conductive film 7 and electrode 1*b*, causing a pulsed current to flow. In this event, since conductive adhesive 8 has a varying thickness along the longitudinal direction of piezoelectric unit 2, the electric resistance between conductive film 7 and the bottom surface of piezoelectric unit 2 also varies along the longitudinal direction of piezoelectric unit 2, resulting in a different current value in piezoelectric unit 2 depending on the longitudinal position of piezoelectric unit 2. Since a current distribution in piezoelectric unit 2 in the longitudinal direction is in general reciprocally proportional to a conduction resistance determined by the thickness of conductive adhesive 8, the current is maximized at the center of piezoelectric unit 2 in the longitudinal direction, and minimized at both ends of piezoelectric unit 2.

Consequently, similar to the configuration of the piezoelectric unit (see FIG. 3) which is further divided into piezoelectric elements, each of which is applied with a current controlled by an associated resistor, a driving current is weighted in accordance with the position on piezoelectric unit 2 in the longitudinal direction, thereby providing for ultrasonic waves with a reduced beam width and suppressed side lobes. Additionally, in this embodiment, since conductive adhesive 8 has a continuously varying thickness, continuous weighting can be carried out to further reduce the beam width, thereby sufficiently suppressing the side lobes.

Since the foregoing embodiment eliminates the need for dividing the piezoelectric unit in the longitudinal direction and for providing extra signal lines as before, the resulting array type ultrasonic probe can facilitate the weighting without requiring an extra manufacturing step.

Figure 5A:
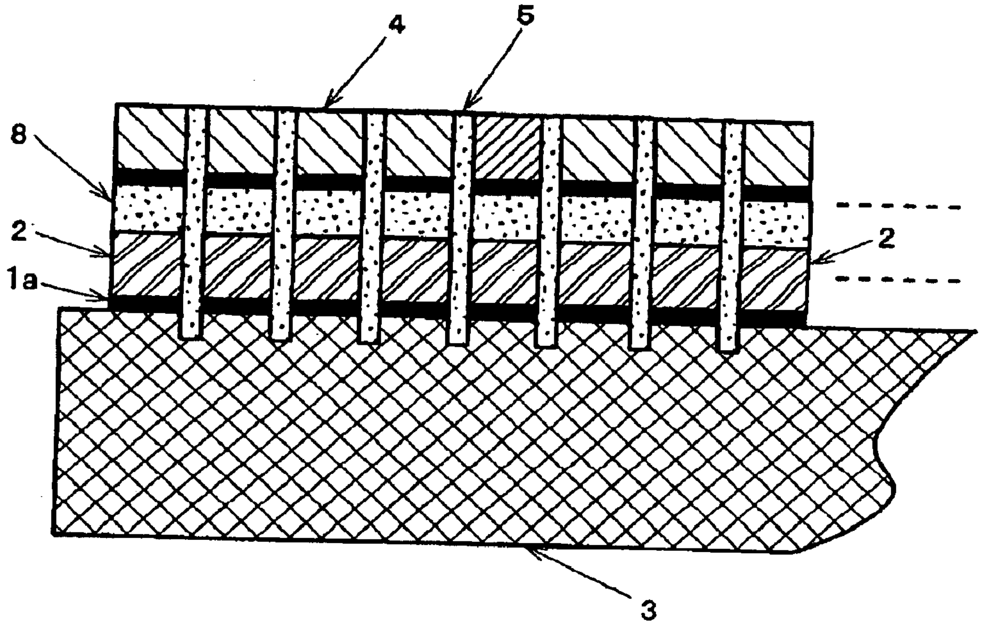
FIGS. 5A and 5B are a front view and a side sectional view, respectively, of an array type ultrasonic probe according to a second embodiment of the present invention.
Figure 5B:
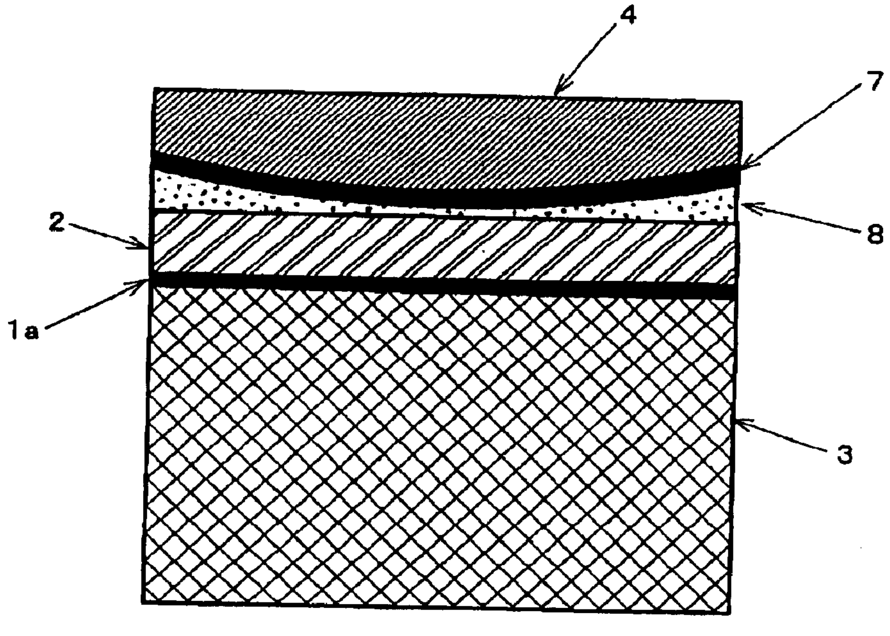

Next, an array type ultrasonic probe according to a second embodiment of the present invention will be described with reference to FIGS. 5A and 5B. In FIGS. 5A and 5B, the same components as those in FIGS. 4A and 4B are designated the same reference numerals. In the first embodiment, the electrode is formed on the surface of piezoelectric unit 2 opposite to acoustic matching layer 4, whereas in the second embodiment, the piezoelectric material is exposed on the surface of ultrasonic unit 2 closer to acoustic matching layer 4, and instead, electrode 1*a* is provided on the surface of piezoelectric unit 2 closer to backing material 3.

Backing material 3 used in this embodiment has a flat top surface, and a plurality of strip-shaped piezoelectric units 2 formed with electrodes 1*a* at the bottom surfaces thereof and having a uniform thickness are directly arranged on backing material 3 in the width direction of piezoelectric units 2.

Acoustic matching layer 4 has a downward convex shape, in other words, it protrudes toward the center of piezoelectric unit 2, and is formed with conductive film 7 on the convex surface as an electrode connected to a ground potential. The top surface of acoustic matching layer 4, i.e., the radiating surface is flat. Then, conductive adhesive 8 is applied between conductive film 7 of acoustic matching layer 4 and the top surface of piezoelectric unit 2. Acoustic matching layer 4 is bonded on piezoelectric units 2 by conductive adhesive 8. Conductive material 8 used herein may be an equivalent to the conductive adhesive in the first embodiment.

Next described is a method of manufacturing the ultrasonic probe. A piezoelectric plate having a size corresponding to a plurality of piezoelectric units 2 and a uniform thickness and formed with electrode 1*a* over the entire bottom surface is bonded on the top surface of backing material 3. Next, conductive adhesive 8 is applied on the piezoelectric plate, so that acoustic matching layer 4 formed with conductive film 7 over the bottom surface thereof is secured on the piezoelectric plate by conductive adhesive 8. Grooves reaching backing material 3 is formed from above acoustic matching layer 4 in order to divide the piezoelectric plate into a plurality of strip-like piezoelectric units 2. In this event, conductive film 7 is also divided by the grooves. Subsequently, filler 5 is applied in the grooves, and, for example, a flexible wiring board, not shown, is connected to electrode 1*a*, thereby completing the ultrasonic probe.

In the configuration as described above, application of a pulsed voltage results in a current generated between electrode 1*a* on the bottom surface of piezoelectric unit 2 and conductive film 7 of acoustic matching layer 4. Then, as is the case with the first embodiment, a conduction resistance resulting from the thickness of conductive adhesive 8 causes a current value to vary depending on the position on piezoelectric unit 2 in the longitudinal direction. Specifically, a resulting current distribution presents a continuously varying current with a maximum at the center of piezoelectric unit 2 in the longitudinal direction, and a minimum at both ends of piezoelectric unit 2. It is therefore possible to achieve the weighting which provides a maximum vibration amplitude at the center of piezoelectric unit 2 in the longitudinal direction to provide an ultrasonic beam with a narrower beam width and sufficiently suppressed side lobes.

Likewise, in the second embodiment, the resulting array type ultrasonic probe can facilitate the weighting without requiring an extra manufacturing step. It should be particularly noted that in the second embodiment, since conductive adhesive 8 is applied in a concave shape on the radiating surface of piezoelectric unit 2, an ultrasonic wave converging effect is further expected based on this concave shape.

Alternatively, in the second embodiment, acoustic matching layer 4 may be formed with a convex radiating surface such that acoustic matching layer 4 itself does not vary in thickness as a whole, irrespective of the position.

Figure 6:
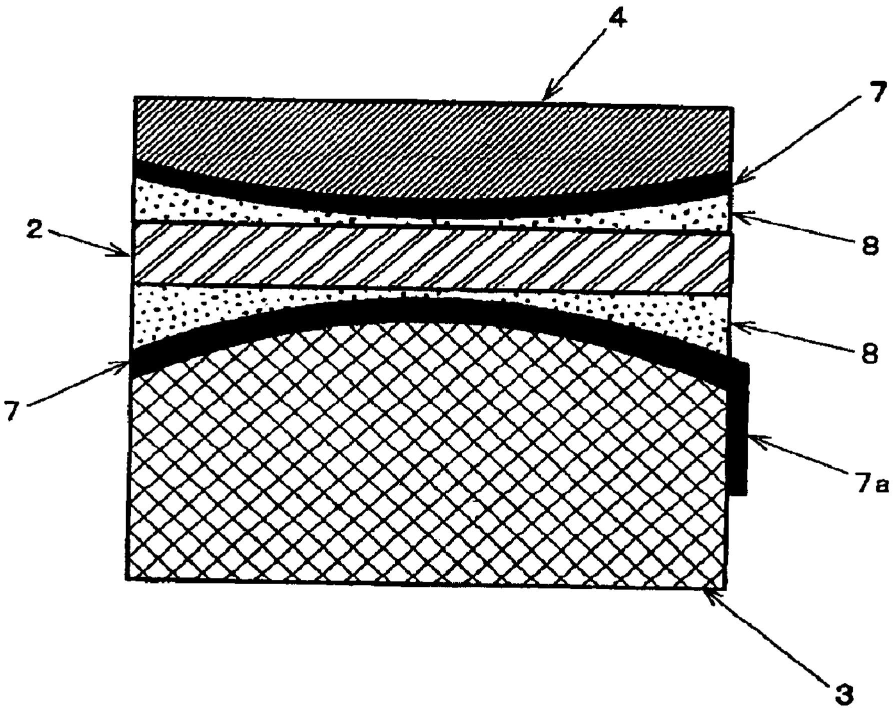
FIG. 6 is a side sectional view of the array type ultrasonic probe according to a third embodiment of the present invention.

Next, a third embodiment of the present invention will be described with reference to FIG. 6. In the first embodiment, the conductive adhesive is applied between the bottom surface of the piezoelectric unit and the backing material, and in the second embodiment, the conductive adhesive is applied between the top surface of the piezoelectric unit and acoustic matching layer, whereas in the third embodiment, a conductive adhesive is applied on both of the top surface and bottom surfaces of piezoelectric unit 2 such that the thickness thereof varies in the longitudinal direction of piezoelectric unit 2.

Specifically, in strip-shaped piezoelectric unit 2 having a uniform thickness according to the third embodiment, the piezoelectric material is exposed on both the top surface and bottom surface. Then, conductive film 7 is formed on the top surface of backing material 3. Backing material 3 is formed in a protrusively curved face such that it has a ridge extending in the longitudinal direction of the ultrasonic probe. Divided conductive film 7*a*, which extends from conductive film 7, is formed on one end face of backing material 3. The bottom surface of piezoelectric unit 2 is secured on backing material 3 as mentioned above by conductive adhesive 8 which continuously varies in thickness. In addition, downward protruding acoustic matching layer 4, which is formed with conductive film 7 on the bottom surface as a ground electrode, is secured on the top surface of piezoelectric unit 2 by conductive adhesive 8 which continuously varies in thickness.

In the configuration as described above, the current value varies in piezoelectric unit 2 depending on the position in the longitudinal direction thereof, due to the varying thickness of conductive adhesive 8, as is the case with the aforementioned first and second embodiments. Specifically, a resulting current distribution presents a continuously varying current with a maximum at the center of piezoelectric unit 2 in the longitudinal direction, and a minimum at both ends of piezoelectric unit 2. Further, in the third embodiment, since conductive adhesives 8 are applied on both the top and bottom surfaces of piezoelectric unit 2 such that their thicknesses vary along the longitudinal direction of piezoelectric unit 2, the weighting can be applied to provide a larger maximum vibration amplitude at the center of piezoelectric unit 2 in the longitudinal direction than the aforementioned embodiments. This can more readily narrow down the beam width and therefore sufficiently suppress side lobes in generated ultrasonic waves. Consequently, the resulting array type ultrasonic probe can facilitate the weighting without requiring an extra manufacturing step and converge ultrasonic waves.

While preferred embodiments of the present invention has been described above, the present invention is not only applied to the array type ultrasonic probe, but can be applied, for example, to an ultrasonic probe having only a single piezoelectric unit, i.e., a so-called single-plate ultrasonic probe. In this case, a single piezoelectric unit made, for example, of a substantially circular flat plate may be secured to spherical backing material 3 to provide ultrasonic waves with narrow beam widths.

While in the foregoing description, conductive film 7 is disposed on the convex surface of backing material 3 or acoustic matching layer 4 by vapor deposition, the method of forming conductive film 7 is not limited to the vapor deposition. For example, a silver foil having a small thickness may be glued to form conductive film 7. Further, the surface of backing material 3 or acoustic matching layer 4 formed in a convex shape is not limited to a continuously curved surface, but may include steps and/or discontinuities.

What is claimed is:

1. An ultrasonic probe comprising:

a backing material;

a piezoelectric unit disposed on said backing material;

an acoustic matching layer disposed on said piezoelectric unit; and a conductive adhesive applied to have a non-uniform thickness in a gap between said piezoelectric unit and said backing material and/or in a gap between said piezoelectric unit and said acoustic matching layer, wherein said piezoelectric unit is applied with a driving current through said conductive adhesive.

2. The ultrasonic probe according to claim 1, wherein said conductive adhesive is applied such that said conductive adhesive has a minimum thickness at a center of a plate surface of said piezoelectric unit and a thickness of said conductive adhesive continuously increases toward a periphery of said piezoelectric unit.

3. The ultrasonic probe according to claim 1, wherein said piezoelectric unit is a strip-shaped piezoelectric unit which has a uniform thickness.

4. The ultrasonic probe according to claim 1, wherein said conductive adhesive has a minimum thickness at a center of said piezoelectric unit in a longitudinal direction thereof and a maximum thickness at both ends of said piezoelectric unit in the longitudinal direction.

5. The ultrasonic probe according to claim 4, wherein a plurality of said piezoelectric units are arranged on said backing material in a width direction of said piezoelectric units.

6. The ultrasonic probe according to claim 4, further comprising:

a first conductive film formed on a top surface of said backing material, said top surface being formed in a convex shape; and a second conductive film formed on a bottom surface of said acoustic matching layer, said bottom surface being formed in a convex shape, wherein said conductive adhesive intervenes between said first conductive film and a bottom surface of said piezoelectric unit and between a top surface of said piezoelectric unit and said second conductive film, respectively.

7. An ultrasonic probe comprising:

a backing material;

a piezoelectric unit disposed on said backing material;

an acoustic matching layer disposed on said piezoelectric unit;

a conductive film formed on a top surface of said backing material, said top surface being formed in a convex shape;

an electrode formed on a top surface of said piezoelectric unit, said acoustic matching layer being bonded on said electrode; and a conductive adhesive applied to have a non-uniform thickness, said conductive adhesive intervening between said conductive film and a bottom surface of said piezoelectric unit, said conductive adhesive having a minimum thickness at a center of said piezoelectric unit in a longitudinal direction thereof and a maximum thickness at both ends of said piezoelectric unit in the longitudinal direction;

wherein said piezoelectric unit is applied with a driving current through said conductive adhesive.

8. An ultrasonic probe comprising:

a backing material;

a piezoelectric unit disposed on said backing material;

an acoustic matching layer disposed on said piezoelectric unit;

a conductive film formed on a bottom surface of said acoustic matching layer, said bottom surface being formed in a convex shape;

an electrode formed on a bottom surface of said piezoelectric unit, said piezoelectric unit being bonded on said backing layer; and a conductive adhesive applied to have a non-uniform thickness, said conductive adhesive intervening between said conductive film and a top surface of said piezoelectric unit, said conductive adhesive having a minimum thickness at a center of said piezoelectric unit in a longitudinal direction thereof and a maximum thickness at both ends of said piezoelectric unit in the longitudinal direction;

wherein said piezoelectric unit is applied with a driving current through said conductive adhesive.

* * * * *